(12) United States Patent
Yamada

(10) Patent No.: US 7,174,530 B2
(45) Date of Patent: Feb. 6, 2007

(54) SYSTEM AND METHOD OF DESIGN FOR TESTABILITY

(75) Inventor: Takamitsu Yamada, Yokohama (JP)

(73) Assignee: Ricoh Company, Ltd., Tokyo (JP)

( * ) Notice: Subject to any disclaimer, the term of this patent is extended or adjusted under 35 U.S.C. 154(b) by 812 days.

(21) Appl. No.: 10/438,541

(22) Filed: May 14, 2003

(65) Prior Publication Data

US 2004/0034815 A1 Feb. 19, 2004

(30) Foreign Application Priority Data

May 15, 2002 (JP) ............................. 2002-140327

(51) Int. Cl.
*G06F 17/50* (2006.01)
(52) U.S. Cl. ............................................. 716/18; 716/4
(58) Field of Classification Search .................. 716/18, 716/4

See application file for complete search history.

(56) References Cited

U.S. PATENT DOCUMENTS 6,080,203 A * 6/2000 Njinda et al. .................. 716/4
7,103,859 B2 * 9/2006 Yamada ........................ 716/4
2003/0149915 A1 * 8/2003 Yamada ....................... 714/31

FOREIGN PATENT DOCUMENTS

| JP | 05241882 | 9/1993 |
| JP | 05249197 | 9/1993 |
| JP | 06103101 | 4/1994 |
| JP | 08015382 | 1/1996 |
| JP | 196339 A2 * | 7/2003 |

* cited by examiner

*Primary Examiner*—Paul Dinh
*Assistant Examiner*—Suchin Parihar
(74) *Attorney, Agent, or Firm*—Cooper & Dunham LLP

(57) ABSTRACT

A system and a method for implementing design for testability is disclosed, in that the method includes the steps of inputting function description data for defining hardware functions represented in the form independent of architecture; recognizing register variables inferable by memory elements, which are contained in the function description data; simulating events induced by affixing random numbers to the register variables; extracting control signals contained in the function description data as extracted control signals; analyzing the results of the simulation with respect to the extracted control signals; inserting test points for control signals having low toggle rates among the extracted control signals; and executing logic synthesis on the control signals having low toggle rates including the test points.

15 Claims, 8 Drawing Sheets

```
module sample (clk, reset, din, . . .);
input clk;
input reset;
input din;
reg data;

always @(posedge clk or negedge reset)
begin
   if (!reset) data <= 0;
   else data <= din;
end . . .
module
``` if (*condition1*) begin

. . .

end else if (*condition2*) begin

. . .

end case (*condition1* or *condition2* or . . .) begin

. . .

. . .

end case assign out = (*condition1*)? in1; in2;

assign out = (condition1)? in1; in2;

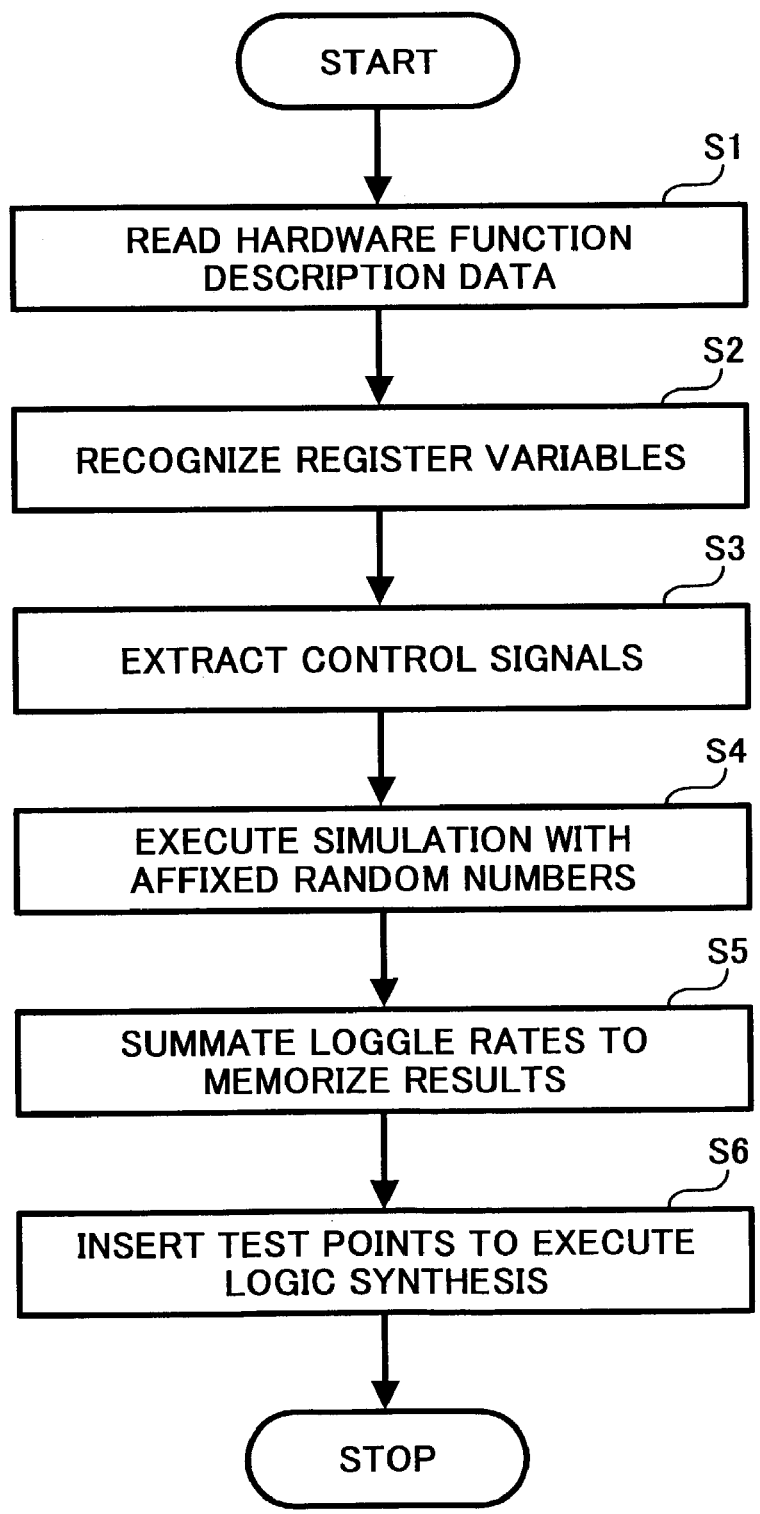

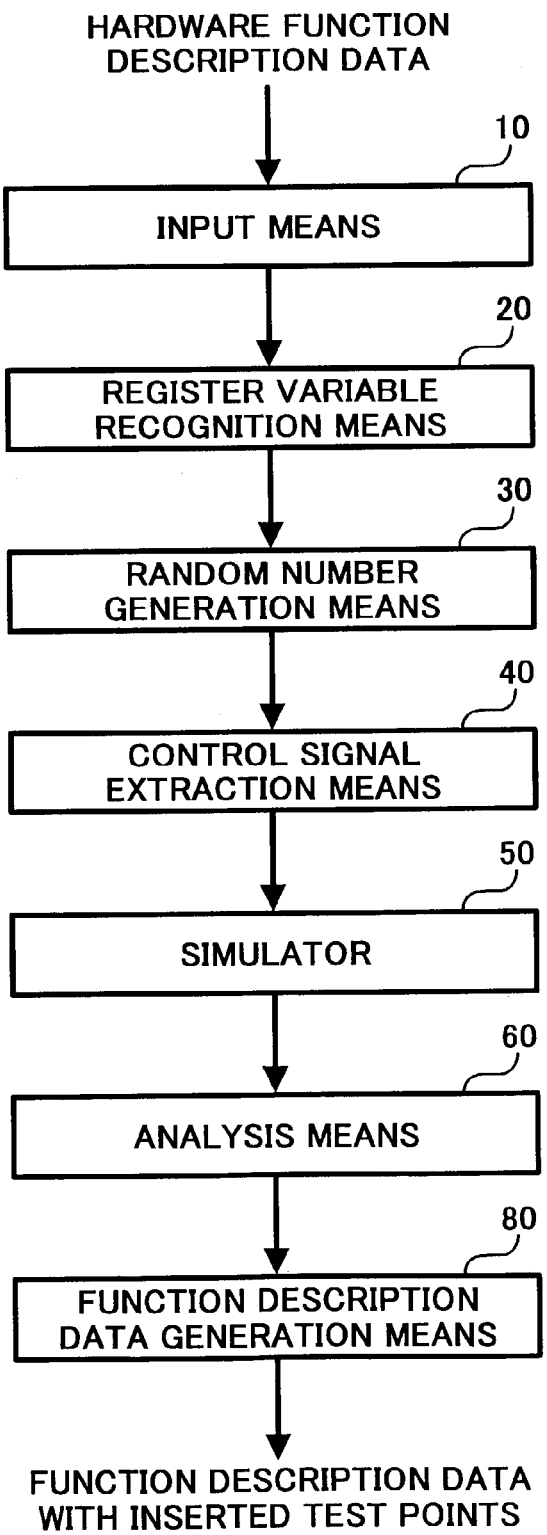

SYSTEM AND METHOD OF DESIGN FOR TESTABILITY

BACKGROUND

1. Field

This patent specification relates generally to a system and a method for implementing design for testability, and more particularly to such method for identifying the portion with reduced controllability and observability at the stage of hardware function description independent of architecture utilizing test inputs from a pseudorandom number generator in the course of testing large scale integrated devices by means of Logic BIST.

2. Discussion of the Background

An integration of semiconductor devices advances toward higher in density and more complex in operation, the period of time for preparing test patterns for integrated circuits is also increasing to such an extent as to exceed their designing time in some cases.

In the process for fabricating large scale integrated devices, therefore, the method of 'Design for Testability (DFT)' has been increasingly indispensable, in that the means for facilitating the generation and execution of device testing is provided in advance at the stage of logic synthesis.

As the DFT method, 'BIST' (Built-in Self Test) has been utilized recently, in that a circuit is incorporated into the integrated circuit to automatically execute necessary testing steps, thereby making it feasible to carry out effective testing in the course of, or succeeding to the device formation at production site.

The LSI testing by means of BIST is carried out by providing interiorly a scan path mechanism, feeding test inputs from a pseudorandom number generator to scan input terminals of the scan path mechanism, and then signature analyzing test results output from the mechanism (Japanese Laid-Open Patent Application No. 5-2418882 and Japanese Patent Published No. 2711492).

In the known process flow for design testing by means of 'LogicBIST' (Logic Built-in Self Test) incorporated into integrated circuit, there consisted are the steps of first generating by logic synthesis a net list corresponding to the technology from hardware function description independent of architecture, adding thereto a scan path mechanism and LogicBIST controller, and verifying fault detection rates by a fault simulator.

In the case where the fault detection rates are relatively small, the flow instructs to confirm controllability and observability based on the reports from the fault simulator and the net list, subsequently supplement test points, and change the hardware function description independent of architecture, in certain instance.

In the known LogicBIST, however, there gives rise to several drawbacks, which follow.

(1) Since the controllability and observability can be verified only after the fault simulation, a certain time period is required for CAD tool execution with respect to several steps such as logic synthesis, scan path, LogicBIST controller insertion, and fault simulator execution.

(2) Since the analysis of the controllability and observability is verified by the net list at the gate level, the analysis is relatively hard to achieve.

(3) The results obtained by the analysis on the controllability and observability are again relatively hard to be reflected onto the hardware function description independent of architecture.

(4) In the case where test points are inserted to the net list after the analysis on the controllability and observability, timing characteristics of the hardware may degrade.

In contrast, LogicBIST with LFSR (linear Feedback Shift Register) is disclosed in Japanese Laid-Open Patent Applications No. 6-103101 and 8-15382.

The former application '101 discloses methods for analyzing testability on net lists at the gate level to improve fault detection rates. This method, however, does not describe the analysis on the testability at the level of the hardware function description independent of architecture.

The latter application '382 relates to several measures on net lists at the gate level with respect to the prevention from the X state propagation (e.g., from data signatures to become indeterminate and degraded upon the propagation of simulated X values) in LogicBIST, and also to the reduction in the number of times of random number generation. The application, however, does not describe the analysis on the testability at the level of hardware function description independent of architecture.

SUMMARY

Accordingly, it is an object of the present disclosure to provide an improved system and method for implementing design for testability, capable of executing controllability and observability analysis at the stage of hardware function description independent of architecture, having most, if not all, of the advantages and features of similar employed systems and methods, while eliminating many of their disadvantages. The present disclosure also relates to computer program products and program storage devices for use in such system and method for design for testability.

The following description is a synopsis of only selected features and attributes of the present disclosure. A more complete description thereof is found below in the section entitled "Description of the Preferred Embodiments".

To achieve the foregoing and other objects, and overcome the disadvantages discussed above, a system for implementing design for testability is provided, including at least means for inputting function description data for defining hardware functions represented in the form independent of architecture;

means for recognizing register variables inferable by memory elements, which are contained in the function description data;

a simulator for simulating events induced by affixing random numbers to the register variables;

extracting means for extracting control signals contained in the function description data as extracted control signals;

means for analyzing simulation results with respect to the extracted control signals, and storing control signals having low toggle rates; and means for inserting test points for control signals having low toggle rates, and executing logic synthesis on the control signals.

According to another embodiment, a further system for implementing design for testability is provided, including means for inputting function description data for defining hardware functions represented in the form independent of architecture;

means for recognizing register variables inferable by memory elements, which are contained in the function description data;

a simulator for simulating events induced by affixing random numbers to the register variables;

extracting means for extracting control signals contained in the function description data as extracted control signals;

means for analyzing simulation results with respect to the extracted control signals, and storing control signals having low toggle rates; and means for inserting test points for the control signals having low toggle rates; and means for generating further description data with respect to the control signals stored as above including the test points.

According to still another embodiment, a system for implementing design for testability is provided, including means for inputting function description data for defining hardware functions represented in the form independent of architecture;

means for recognizing register variables inferable by memory elements, which are contained in the function description data;

a simulator for simulating events induced by affixing random numbers to the register variables;

extracting means for extracting control signals contained in the function description data as extracted control signals;

means for analyzing simulation results with respect to the extracted control signals, and storing control signals having low toggle rates; and means for inserting test points into a net included in the logical interconnection information corresponding to control signals having low toggle rates after the results of the logic synthesis, based on logical interconnection information included in results of logic synthesis previously executed.

According to another embodiment, a method for implementing design for testability is provided, including the steps of inputting function description data for defining hardware functions represented in the form independent of architecture;

recognizing register variables inferable by memory elements, which are contained in the function description data;

simulating events induced by affixing random numbers to the register variables;

extracting control signals contained in the function description data as extracted control signals;

analyzing simulation results with respect to the extracted control signals;

inserting test points for control signals having low toggle rates among the extracted control signals; and executing logic synthesis on the control signals having low toggle rates including the test points.

According to another embodiment, a further method for implementing design for testability is provided, including the steps of inputting function description data for defining hardware functions represented in the form independent of architecture;

recognizing register variables inferable by memory elements, which are contained in the function description data;

simulating events induced by affixing random numbers to the register variables;

extracting control signals contained in the function description data as extracted control signals;

analyzing simulation results with respect to the extracted control signals;

inserting test points for control signals having low toggle rates among the extracted control signals; and generating further description data with respect to the control signals having low toggle rates including the test points.

According to another embodiment, a further method for implementing design for testability is provided, including the steps of inputting function description data for defining hardware functions represented in the form independent of architecture;

recognizing register variables inferable by memory elements, which are contained in the function description data;

simulating events induced by affixing random numbers to the register variables;

extracting control signals contained in the function description data as extracted control signals;

analyzing simulation results with respect to the extracted control signals;

inserting test points for control signals having low toggle rates among the extracted control signals; and inserting test points into a net included in the logical interconnection information corresponding to control signals having low toggle rates after the results of logic synthesis previously executed, based on logical interconnection information included in results of the logic synthesis.

Also disclosed are computer program products for use with the systems for implementing design for testability disclosed herein, including a computer usable medium having computer readable program code means embodied in the medium for causing the steps for design for testability, which includes several means disclosed herein above.

Additionally disclosed are program storage devices readable by a machine, tangibly embodying a program of instructions executable by the machine to perform process steps for implementing design for testability, which include the steps disclosed herein above.

As a result of the present construction of the system and method of design for testability disclosed herein, several advantages can be provided over those previously known.

For example, control signals for test data and controller, by which a noticeable decrease is caused in controllability and observability, are extracted utilizing test data including pseudorandom numbers in LogicBIST at the stage of hardware function description independent of architecture, logic synthesis including inserted test points is carried out, and thereby timing convergence steps for the logic synthesis are implemented including test points.

As a result, static timing analysis and undue repletion of logic synthesis can be obviated, and DFT testing measures can be provided at the stage of hardware function description, thereby facilitating the reduction in the device design period.

Since function description data are generated without logic synthesis steps, as described earlier, the function description data are obtained already including testing measures, and the thus obtained data are utilized as the means for device designing without modification. In addition, the process steps succeeding to logic synthesis can be interfaced without undue regard to the LogicBIST. As a result, complexity and complication in designing can be alleviated.

Furthermore, since test points are provided to be inserted corresponding to logical interconnection information included in the results of the logic synthesis previously executed, undue repeated use of fault simulator can be alleviated, thereby facilitating the reduction in device designing period.

The present disclosure and features and advantages thereof will be more readily apparent from the following detailed description and appended claims when taken with drawings.

BRIEF DESCRIPTION OF THE DRAWINGS

FIG. 8 includes a flow chart illustrating process steps described in Example 1;

FIG. 9 is a block diagram illustrating the functional structure of a further DFT system described in Example 2.

DESCRIPTION OF THE PREFERRED EMBODIMENTS

In the following description accompanied by several drawings, specific embodiments of the system and method for logic synthesis are detailed, which is particularly useful to logic BIST.

It is understood, however, that the present disclosure is not limited to these embodiments. For example, the use of the system and method with inserted test points for the logic synthesis are capable of providing excellent functions of device testing in other system configurations as well. Other embodiments will be apparent to those skilled in the art upon reading the following description.

In the test data using pseudorandom numbers in LogicBIST, as described earlier, controllability and observability are generally affected by probability factors dependent on circuit construction.

Particularly, in the case where control signals for data path and controller are provided with the circuit construction hard to be toggled by the use of pseudorandom numbers, a noticeable decrease arises in controllability and observability.

Figures 5, 6:
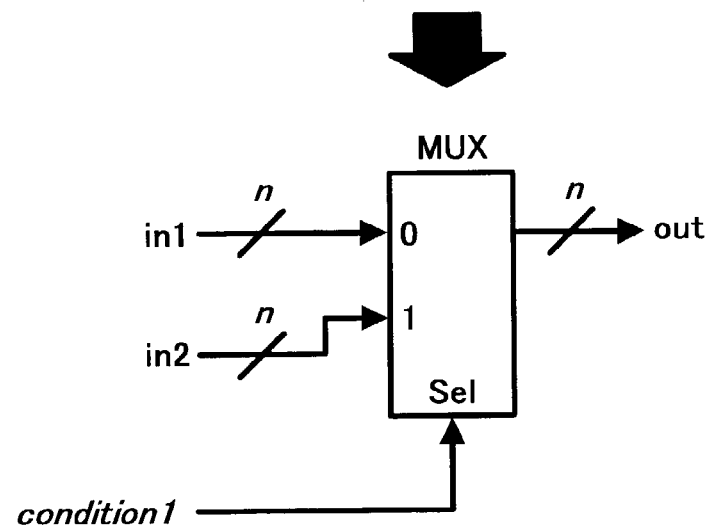
FIG. 5 illustrates the known function description related to control signals.
FIG. 6 illustrates the test bench for affixing the random numbers corresponding to the function description data of FIG. 5.

As illustrated in the function description of FIG. 5, for example, if the control signal for 'condition 1' remains fixed to either logical 1 or 0, the controllability and observability for in1, in2 and out decrease considerably.

It is therefore a primary objective of this disclosure to provide a logic synthesis with improved controllability and observability by means of the insertion of test points with respect to the control signals for data path and controller, hard to be toggled with pseudorandom numbers.

Figure 1:
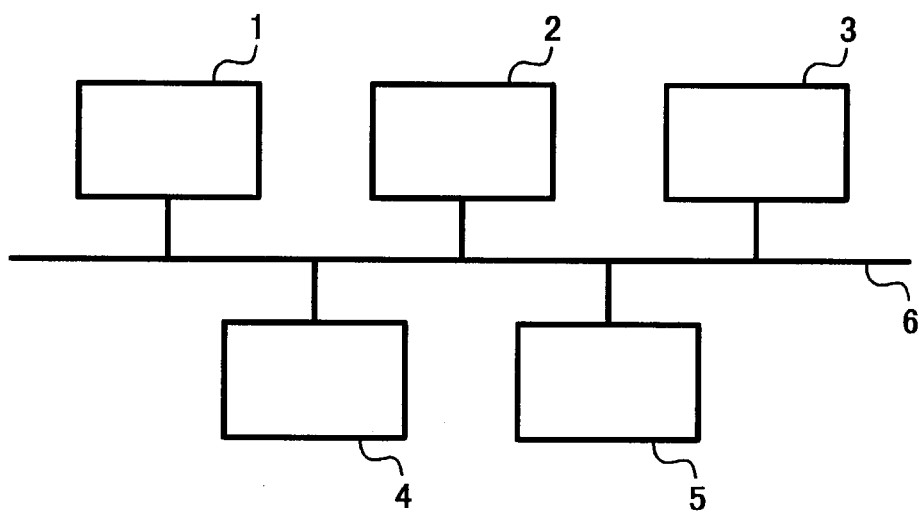
FIG. 1 is a block diagram illustrating the major components of the computer system for implementing design for testability according to one embodiment disclosed herein.

FIG. 1 is a block diagram illustrating the major components of the computer system for implementing design for testability according to one embodiment disclosed herein.

Referring to FIG. 1, the computer system includes at least an input unit 1, display unit 2, CPU (central processing unit) 3, memory device 4 and storage unit 5, which are interconnected by way of a system bus 6.

The input unit 1 consisting of a keyboard, mouse, touch panel or other similar devices is adapted for interactively inputting the instruction for the input, edition and execution of hardware function description language independent of architecture.

The display unit 2 consisting of a commercially available display device such as, for example, a liquid crystal display and other similar devices, is adapted for displaying the content of hardware function description independent of architecture, information inputted from input unit 1, and the process of, and results of the execution.

The CPU 3 is adapted to the execution of a variety of programs.

The memory device 4 is utilized for storing the programs and information which is temporarily generated during the execution of the programs by the CPU 3.

The storage unit 5 is adapted for storing the hardware function description independent of architecture, various data, programs functional for embodying the features of the present embodiment, temporary information during the execution of the programs, and processed results which are instructed to be output to a file.

EXAMPLE 1

Figure 2:
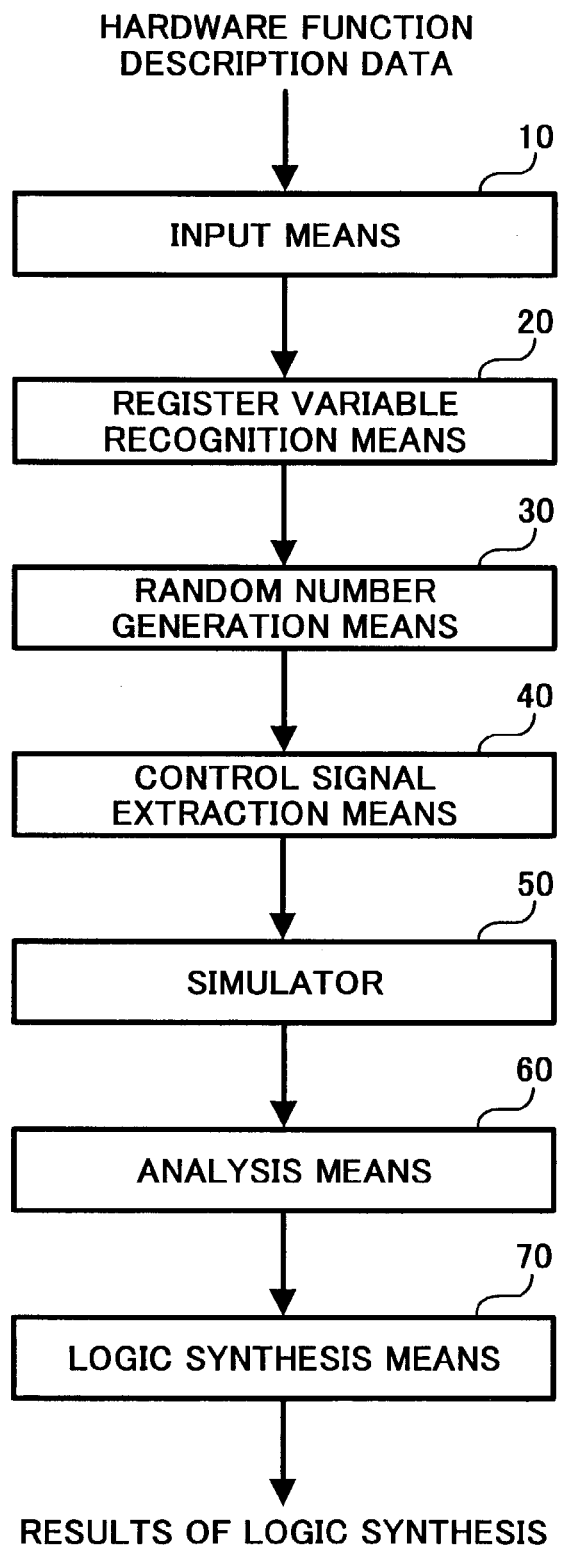
FIG. 2 is a block diagram illustrating the functional structure of the system for implementing design for testability according to one embodiment disclosed herein.

FIG. 2 is a block diagram illustrating the functional structure of the system for implementing design for testability (DFT system) according to one embodiment disclosed herein.

Referring to FIG. 2, the functional structure includes an input means 10, register variable recognition means 20, random number generation means 30, control signal extraction means 40, simulator 50, analysis means 60, and logic synthesis means 70.

The input means 10 is adapted to read the hardware function description independent of architecture by input unit 1 to be stored temporarily in the storage unit 5 for use in the following process.

The hardware function description independent of architecture is herein made in terms of the description language such as, for example, VHDL (very high speed IC (VHSIC) hardware description language (HDL)) and Verilog-HDL, which are standardized by IEEE.

The input means 10 may alternatively be adapted to read out the hardware function description previously stored in the storage unit 5.

The register variable recognition means 20 is adapted to recognize register variables inferable by memory elements, contained in the hardware function description read by input means 10.

For the description language such as VHDL and Verilog-HDL, the format for instructing memory device to the inference is specified by logic synthesis system.

Figures 3, 4:
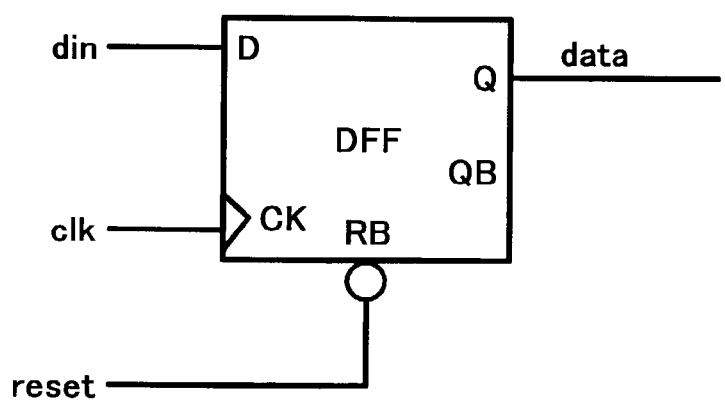
FIG. 3 illustrates the hardware function description in Verilog-HDL.
FIG. 4 illustrates a flip-flop circuit as the circuit inferred by the hardware function description of FIG. 3.

For example, in reference to FIG. 3 for Verilog-HDL, the sensitivity with respect to the variable declared as the register variable is described in terms of the posedge description in always statement according to clock timing.

The register variable recognition means 20 is adapted to detect the above noted format by means of the previously read hardware function description and then recognize the variable on the left side of the equation as the one recognizable by flip-flop circuits of the logic synthesis system.

The register variables can be transferred to scan cells as the result of scan path insertion of full scan path logically synthesized by the logic synthesis system, and thereby function as control points for the test data consisting pseudorandom numbers in LogicBIST.

The flip-flop circuit inferred by the hardware function description of FIG. 3, for example, has the circuit construction of FIG. 4.

The random number generation means 30 functions to generate pseudorandom numbers to be affixed to register variables recognized by register variable recognition means 20 followed by the execution of simulation steps.

The status of test input in LogicBIST, therefore, becomes recognizable by the hardware function description independent of architecture.

The control signal extraction means 40 is adapted to recognize and extract control signals for data path and controller. In the case of Verilog-HDL for example, this is carried out by first recognizing, by means of the PLI (Programming Language Institute) access routine, the signals corresponding to specific conditional equation which dictates branching of operation or selection of data by the if-else or case statement, or conditional operation statement, and second by extracting the thus recognized signals.

The simulator 50 is a functional simulator adapted to carry out the simulation of hardware function description stored in storage unit 5, which may suitably utilize a commercially available simulator.

The above noted random number generation means 30 may alternatively be formed including the PLI simulator access routines for the simulator 50 and test benches input into in the simulator.

In the case of the test bench for Verilog-HDL simulator, for example, the random numbers can be input directly to the register variables recognized by register variable recognition means 20 by means of the force statement and $random system task.

Incidentally, it may be added the force statement in Verilog-HDL simulator can directly be input even in the case the inputting the data is not through an external port. For example, the test bench for affixing the random numbers has the structure of FIG. 6 for the function description data illustrated in FIG. 5.

By using the simulator 50 and by affixing random numbers onto register variables recognized by register variable recognition means 20, therefore, the status of test input in LogicBIST can be ascertained.

The step of the simulation with affixing the random numbers is repeated the number of times, for example, such that sufficiently large toggle rates can be generated for the bit width of bus variables in hardware function description.

Following the simulation steps, the analysis means 60 functions to summate event occurrence rates and toggle rates for internal variables in the net or bus for the hardware function description, analyze the controllability and observability, and memorize control signals each having low toggle rates among the control signals extracted from the control signal extraction means 40.

In the case where a commercially available simulator is utilized as the simulator 50, the results of the simulation on the event occurrence status are output as a dump file. As a result, the event occurrence rates and toggle rates for internal variables can be calculated with relative ease.

In contrast, when the PLI simulator access routine is used for the simulation, the event occurrence rates and toggle status can be confirmed without the aid of the dump file.

The logic synthesis means 70 is adapted to carry out logic synthesis so as to insert a test point corresponding to the control signals previously memorized in response to the instruction from the analysis means 60.

It is noted herein that the insertion of the test point is carried out for the function description data such that timing convergence steps for the logic synthesis are implemented including the test point.

As a logic synthesis engine, a commercial logic synthesizer may be used. In this case, the test point insertion may be carried out utilizing several commands such as interconnect modification commands, supplement and deletion, provided by the commercial logic synthesizer.

Figure 7A:
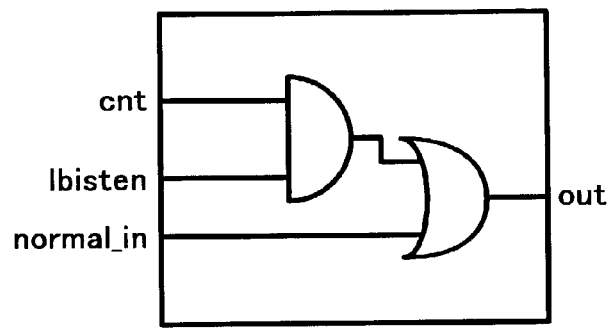
FIGS. 7A through 7C are each block diagrams illustrating test circuits in use for the circuit insertion.
Figure 7B:
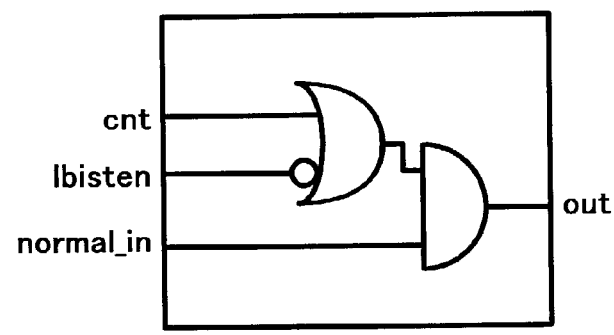
Figure 7C:
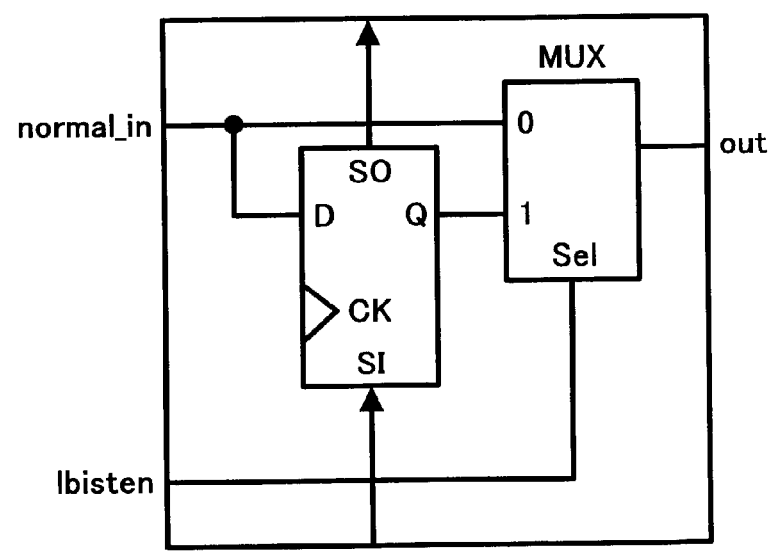

FIGS. 7A through 7C are each block diagrams illustrating test points in use for the circuit insertion.

There indicated in the drawings are (1) a 1bisten signal which represents the logical value 1 only for executing LogicBIST such that operations other than those by original hardware capabilities are performed to improve the controllability, (2) a cnt signal which instructs to connect output signals from surrounding scan cells and make the control feasible by pseudo random numbers and (3) a normal in signal represents the input path for executing original LSI capabilities.

The test circuit illustrated in FIG. 7A is provided to be inserted for the control signal that represents almost always the logical value 1 and rarely toggles to the logical value 0.

In contrast, the test circuit of FIG. 7B is used for the control signal that represents almost always the logical value 0 and rarely toggles to the logical value 1.

The test circuit of FIG. 7C may be utilized for either one of the above noted control signals.

By means of the above construction utilizing test data with respect to the pseudo random numbers, the logic synthesis disclosed herein can therefore be executed through the insertion of test points for control signals that are hard to be toggled.

As a result, the causes of noticeable decrease, if any, in controllability and observability can be examined even at the stage of function description.

In addition, since necessary test points are inserted and the timing convergence has been attempted during the logic synthesis, undue repletion of synthesis steps can be obviated.

FIG. 8 includes a flow chart illustrating process steps of Example 1.

The hardware function description independent of architecture is read by input unit 1 to be stored temporarily in the storage unit 5 (step S1).

Being contained in the hardware function description read by input means 10, register variables inferable by memory elements are recognized and extracted (step S2).

The signals necessary for controlling data path and controller are recognized and extracted (step S3).

Subsequently, random numbers are affixed to the thus extracted register variables and then the simulation is carried out (step S4).

The step of the simulation with affixing the random numbers is in general repeated plural times. The number of times for the reception is specified by the design engineer after taking the bit width of bus variable into consideration in the hardware function description.

Thereafter, the events generated during the simulation are summated and the control signals having low toggle rates among those previously extracted are memorized (step S5).

Test points are inserted with respect to the control signals memorized at step S5 and the simulation is subsequently carried out (step S6).

EXAMPLE 2

FIG. 9 is a block diagram illustrating the functional structure of a further DFT system according to another embodiment disclosed herein.

Referring to FIG. 9, the functional structure of Example 2 includes an input means 10, register variable recognition means 20, random number generation means 30, control signal extraction means 40, simulator 50, analysis means 60, and function description data generation means 80.

Like reference numerals in FIG. 9 designate the components each having the same or corresponding function of those in FIG. 2 (Example 1), in which the description on these components is herein abbreviated. The description on other components is included as follows.

The function description data generation means 80 functions to generate function description data with test points inserted with respect to the control signals having low toggle rates among the control signals extracted from the control signal extraction means 40.

For example, function description data are first parsed using a parser of Verilog-HDL, test points are inserted to function description structure created in the memory, and then corrections are made. By subsequently outputting the function description structure which are created in the memory and then corrected as noted just above, in either Verilog-HDL or VHDL, the function description data are thereby generated.

Since the function description data which have been inserted with test points, are obtained with the structure described above, means for device designing can be obtained, which is already examined by the function description data.

As a result, the interfacing to the process steps succeeding to logic synthesis becomes feasible without undue regard to the LogicBIST.

EXAMPLE 3

Figure 10:
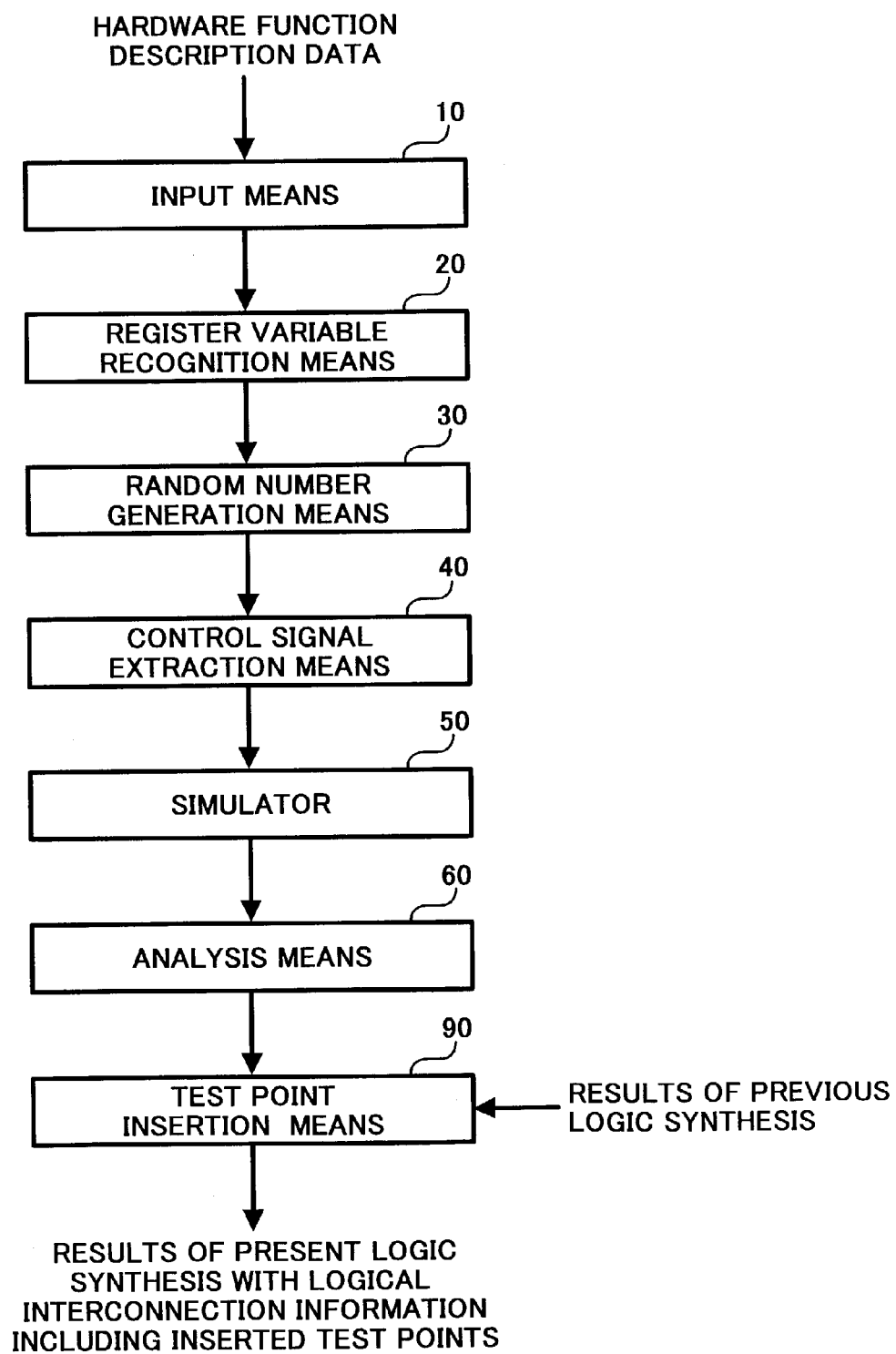
FIG. 10 is a block diagram illustrating the functional structure of a still further DFT system described in Example 3.

FIG. 10 is a block diagram illustrating the functional structure of a DFT system according to still another embodiment disclosed herein.

Referring to FIG. 10, the functional structure of Example 3 includes an input means 10, register variable recognition means 20, random number generation means 30, control signal extraction means 40, simulator 50, analysis means 60, and test point insertion means 90.

Like reference numerals in FIG. 10 designate the components each having the same or corresponding function of those in FIG. 2 (Example 1), in which the description on these components is herein abbreviated. The description on other components is included as follows.

The test point insertion means 90 instructs to read the results obtained by logic synthesis of the function description data input by the input means 10, and, based on logical interconnection information included in the thus read logic synthesis results, to insert test points corresponding to the control signals memorized by the analysis means 60.

The insertion of test point insertion into logical interconnection information may be carried out in a manner of automatic processing as batch process of the script type using interconnect modification commands provided by a commercial logic synthesizer.

By incorporating the structure described above, the improvement in controllability and observability becomes feasible even without fault simulation.

While the present disclosure has been described in connection of the preferred embodiments, it is not intended to limit the disclosure. On the contrary, it is intended to cover other alternatives.

For example, the above noted functions related to the embodiments can alternatively be implemented by programming, recording into CD-ROM and other similar recording medium, loading the CD-ROM onto a computer equipped with a reading unit such as a CD-ROM drive, storing the programs into either memory or storage unit, and reading out and then executing the programs by the instructions by a CPU.

Alternatively, in the case where these programs are stored into ROM (Read Only Memory), the use of the above mentioned CD-ROM drive can be abbreviated.

Since the programs themselves read out from the storage unit are utilized for implementing the present embodiments, the programs and program storage devices can also be the constituents of this disclosure.

Suitable examples of recording media useful in the present embodiments includes semiconductor recording media such as ROM, non-volatile memory card, etc; optical recording media such as DVD, MO, CD-R, etc; and magnetic recording media such as magnetic tape, flexible disk, etc.

In addition, the present disclosure include not only the case where the execution of loaded programs achieve the functions noted in the above embodiments, but also the case where at least the portion of process is carried out by an operating system, for example, through the instruction of the programs and the entire functions in the embodiments can thereby be realized.

Alternatively, the noted programs may be stored in a memory unit such as a magnetic disk of server computer and distributed by downloading to user computers interconnected by way of network system such as the internet, for example. The noted memory unit in the server computer may therefore be included as one example of the recording media in the present disclosure.

The systems and process steps set forth in the present description may therefore be implemented using the host computer and terminals disclosed herein incorporating appropriate processors programmed according to the teachings disclosed herein, as will be appreciated to those skilled in the relevant arts.

As described earlier, the present disclosure therefore includes a computer-based product which may be hosted on a storage medium and include instructions which can be used to program a processor to perform a process in accordance with the present disclosure. The storage medium can include, but is not limited to, those mentioned earlier including any type of media suitable for storing electronic instructions.

It is apparent from the above description including the examples, the system and method disclosed herein can provide several advantages over similar systems and methods previously known.

For example, as described earlier, control signals for test data and controller, by which a noticeable decrease is caused in controllability and observability, are extracted utilizing test data including pseudorandom numbers in LogicBIST at the stage of hardware function description independent of architecture, logic synthesis including inserted test points is carried out, and thereby timing convergence steps for the logic synthesis are implemented taking the test points into consideration.

As a result, static timing analysis and undue repletion of logic synthesis can be obviated. In addition, DFT testing measures can be provided also at the stage of hardware function description, thereby facilitating the reduction in the device design period.

Since function description data are generated without logic synthesis steps according to the present disclosure, the function description data are obtained already including testing measures, and the thus obtained data are utilized as the means for device designing without modification.

In addition, the process steps succeeding to logic synthesis can be interfaced without undue regard to the LogicBIST. As a result, complexity and complication in designing can be alleviated.

Furthermore, since test points are provided to be inserted corresponding to already synthesized logical interconnection information included in the results of the logic synthesis previously executed, undue repeated use of fault simulator can be alleviated, thereby facilitating the reduction in device designing period.

Additional modifications and variations of the present invention are possible in light of the above teachings. It is therefore to be understood that within the scope of the appended claims, the invention may be practiced other than as specifically described herein.

This document claims priority and contains subject matter related to Japanese Patent Application No. 2002-140327, filed with the Japanese Patent Office on May 15, 2002, the entire contents of which are hereby incorporated by reference.

What is claimed is:

1. A system for implementing design for testability, comprising:
    a unit for inputting function description data for defining hardware functions represented in a form independent of architecture;
    a recognition unit for recognizing register variables inferable by memory elements, said register variables being contained in said function description data;
    a simulator for simulating events induced by affixing random numbers to said register variables;
    a unit for extracting control signals contained in said function description data as extracted control signals;
    an analyzer for analyzing simulation results with respect to said extracted control signals;
    a unit for inserting test points for control signals having low toggle rates among said extracted control signals; and
    a unit for executing logic synthesis on said control signals having low toggle rates including said test points.

2. A system for implementing design for testability, comprising:
    a unit for inputting function description data for defining hardware functions represented in a form independent of architecture;
    a recognition unit for recognizing register variables inferable by memory elements, said register variables being contained in said function description data;
    a simulator for simulating events induced by affixing random numbers to said register variables;
    a unit for extracting control signals contained in said function description data as extracted control signals;
    an analyzer for analyzing simulation results with respect to said extracted control signals;
    a unit for inserting test points for control signals having low toggle rates among said extracted control signals; and
    a unit for generating further description data with respect to said control signals having low toggle rates including said test points.

3. A system for implementing design for testability, comprising:
    a unit for inputting function description data for defining hardware functions represented in a form independent of architecture;
    a recognition unit for recognizing register variables inferable by memory elements, said register variables being contained in said function description data;
    a simulator for simulating events induced by affixing random numbers to said register variables;
    a unit for extracting control signals contained in said function description data as extracted control signals;
    an analyzer for analyzing simulation results with respect to said extracted control signals;
    a unit for executing logic synthesis on said function description data inputted previously; and
    a unit for inserting test points into a net included in logical interconnection information corresponding to control signals having low toggle rates after results of said logic synthesis, based on logical interconnection information included in results of said logic synthesis.

4. A system for implementing design for testability, comprising:
    means for inputting function description data for defining hardware functions represented in a form independent of architecture;
    means for recognizing register variables inferable by memory elements, said register variables being contained in said function description data;
    means for simulating events induced by affixing random numbers to said register variables;
    means for extracting control signals contained in said function description data as extracted control signals;
    means for analyzing simulation results with respect to said extracted control signals;
    means for inserting test points for control signals having low toggle rates among said extracted control signals; and
    means for executing logic synthesis on said control signals having low toggle rates including said test points.

5. A system for implementing design for testability, comprising:
    means for inputting function description data for defining hardware functions represented in a form independent of architecture;
    means for recognizing register variables inferable by memory elements, said register variables being contained in said function description data;
    means for simulating events induced by affixing random numbers to said register variables;
    means for extracting control signals contained in said function description data as extracted control signals;
    means for analyzing simulation results with respect to said extracted control signals;
    means for inserting test points for control signals having low toggle rates among said extracted control signals; and
    means for generating further description data with respect to said control signals having low toggle rates including said test points.

6. A system for implementing design for testability, comprising:

means for inputting function description data for defining hardware functions represented in a form independent of architecture;

means for recognizing register variables inferable by memory elements, said register variables being contained in said function description data;

means for simulating events induced by affixing random numbers to said register variables;

means for extracting control signals contained in said function description data as extracted control signals;

means for analyzing simulation results with respect to said extracted control signals;

means for executing logic synthesis on said function description data inputted previously; and means for inserting test points into a net included in logical interconnection information corresponding to control signals having low toggle rates after results of said logic synthesis, based on logical interconnection information included in results of said logic synthesis.

7. A method for implementing design for testability, comprising the steps of:

inputting function description data for defining hardware functions represented in a form independent of architecture;

recognizing register variables inferable by memory elements, said register variables being contained in said function description data;

simulating events induced by affixing random numbers to said register variables;

extracting control signals contained in said function description data as extracted control signals;

analyzing simulation results with respect to said extracted control signals;

inserting test points for control signals having low toggle rates among said extracted control signals; and executing logic synthesis on said control signals having low toggle rates including said test points.

8. A method for implementing design for testability, comprising the steps of:

inputting function description data for defining hardware functions represented in a form independent of architecture;

recognizing register variables inferable by memory elements, said register variables being contained in said function description data;

simulating events induced by affixing random numbers to said register variables;

extracting control signals contained in said function description data as extracted control signals;

analyzing simulation results with respect to said extracted control signals;

inserting test points for control signals having low toggle rates among said extracted control signals; and generating further description data with respect to said control signals having low toggle rates including said test points.

9. A method for implementing design for testability, comprising the steps of:

inputting function description data for defining hardware functions represented in a form independent of architecture;

recognizing register variables inferable by memory elements, said register variables being contained in said function description data;

simulating events induced by affixing random numbers to said register variables;

extracting control signals contained in said function description data as extracted control signals;

analyzing simulation results with respect to said extracted control signals;

executing logic synthesis on said function description data inputted previously; and based on logical interconnection information included in results of said logic synthesis, inserting test points into a net included in said logical interconnection information corresponding to control signals having low toggle rates after results of said logic synthesis.

10. A computer program product for use with a system for implementing design for testability, said computer program product comprising:

a computer usable medium having computer readable program code means embodied in said medium for causing the steps for design for testability, said computer readable program code means comprising:

means for inputting function description data for defining hardware functions represented in a form independent of architecture;

means for recognizing register variables inferable by memory elements, said register variables being contained in said function description data;

means for simulating events induced by affixing random numbers to said register variables;

means for extracting control signals contained in said function description data as extracted control signals;

means for analyzing simulation results with respect to said extracted control signals;

means for inserting test points for control signals having low toggle rates among said extracted control signals; and means for executing logic synthesis on said control signals having low toggle rates including said test points.

11. A computer program product for use with a system for implementing design for testability, said computer program product comprising:

a computer usable medium having computer readable program code means embodied in said medium for causing the steps for design for testability, said computer readable program code means comprising:

means for inputting function description data for defining hardware functions represented in a form independent of architecture;

means for recognizing register variables inferable by memory elements, said register variables being contained in said function description data;

means for simulating events induced by affixing random numbers to said register variables;

means for extracting control signals contained in said function description data as extracted control signals;

means for analyzing simulation results with respect to said extracted control signals;

means for inserting test points for control signals having low toggle rates among said extracted control signals; and means for generating further description data with respect to said control signals having low toggle rates including said test points.

12. A computer program product for use with a system for implementing design for testability, said computer program product comprising:

a computer usable medium having computer readable program code means embodied in said medium for causing the steps for design for testability, said computer readable program code means comprising:

means for inputting function description data for defining hardware functions represented in a form independent of architecture;

means for recognizing register variables inferable by memory elements, said register variables being contained in said function description data;

means for simulating events induced by affixing random numbers to said register variables;

means for extracting control signals contained in said function description data as extracted control signals;

means for analyzing simulation results with respect to said extracted control signals;

means for executing logic synthesis on said function description data inputted previously; and means for inserting test points into a net included in logical interconnection information corresponding to control signals having low toggle rates after results of said logic synthesis, based on logical interconnection information included in results of said logic synthesis.

13. A program storage device readable by a machine, tangibly embodying a program of instructions executable by the machine to perform method steps for implementing design for testability, said method steps comprising:

inputting function description data for defining hardware functions represented in a form independent of architecture;

recognizing register variables inferable by memory elements, said register variables being contained in said function description data;

simulating events induced by affixing random numbers to said register variables;

extracting control signals contained in said function description data as extracted control signals;

analyzing simulation results with respect to said extracted control signals;

inserting test points for control signals having low toggle rates among said extracted control signals; and executing logic synthesis on said control signals having low toggle rates including said test points.

14. A program storage device readable by a machine, tangibly embodying a program of instructions executable by the machine to perform method steps for implementing design for testability, said method steps comprising:

inputting function description data for defining hardware functions represented in a form independent of architecture;

recognizing register variables inferable by memory elements, said register variables being contained in said function description data;

simulating events induced by affixing random numbers to said register variables;

extracting control signals contained in said function description data as extracted control signals;

analyzing simulation results with respect to said extracted control signals;

inserting test points for control signals having low toggle rates among said extracted control signals; and generating further description data with respect to said control signals having low toggle rates including said test points.

15. A program storage device readable by a machine, tangibly embodying a program of instructions executable by the machine to perform method steps for implementing design for testability, said method steps comprising:

inputting function description data for defining hardware functions represented in a form independent of architecture;

recognizing register variables inferable by memory elements, said register variables being contained in said function description data;

simulating events induced by affixing random numbers to said register variables;

extracting control signals contained in said function description data as extracted control signals;

analyzing simulation results with respect to said extracted control signals;

executing logic synthesis on said function description data inputted previously; and based on logical interconnection information included in results of said logic synthesis, inserting test points into a net included in said logical interconnection information corresponding to control signals having low toggle rates after results of said logic synthesis.

* * * * *